United States Patent
Ma et al.

(10) Patent No.: US 11,862,434 B2
(45) Date of Patent: Jan. 2, 2024

(54) SUBSTRATE PROCESSING APPARATUS

(71) Applicant: PSK INC., Gyeonggi-do (KR)

(72) Inventors: Young Jae Ma, Gyeonggi-do (KR);
Sung Jin Yoon, Gyeonggi-do (KR);
Hyo Jeong Seo, Gyeonggi-do (KR);
Jong Woo Park, Gyeonggi-do (KR)

(73) Assignee: PSK INC., Hwaseong-si (KR)

( * ) Notice: Subject to any disclaimer, the term of this patent is extended or adjusted under 35 U.S.C. 154(b) by 49 days.

(21) Appl. No.: 17/117,720

(22) Filed: Dec. 10, 2020

(65) Prior Publication Data

US 2021/0193440 A1 Jun. 24, 2021

(30) Foreign Application Priority Data

Dec. 18, 2019 (KR) ........................ 10-2019-0169528

(51) Int. Cl.
*H01J 37/32* (2006.01)
*C23C 4/04* (2006.01)

(52) U.S. Cl.
CPC ...... *H01J 37/32477* (2013.01); *H01J 37/321* (2013.01); *H01J 37/3222* (2013.01); *C23C 4/04* (2013.01)

(58) Field of Classification Search
CPC ..... C23C 4/04; C23C 16/4404; C23C 28/042; H01J 37/321–32119; H01J 37/3222; H01J 37/32477–32504
See application file for complete search history.

(56) References Cited

U.S. PATENT DOCUMENTS

| | | | |
|---|---|---|---|
| 2001/0003271 A1* | 6/2001 | Otsuki | C23C 16/45561 156/914 |
| 2004/0002221 A1* | 1/2004 | O'Donnell | H01J 37/32467 438/710 |
| 2005/0136188 A1* | 6/2005 | Chang | H01J 37/32477 156/345.52 |
| 2005/0199183 A1 | 9/2005 | Arai et al. | |

(Continued)

FOREIGN PATENT DOCUMENTS

| | | |
|---|---|---|
| CN | 103959447 A | 7/2014 |
| CN | 110223945 A | 9/2019 |

(Continued)

OTHER PUBLICATIONS

Office Action for related Korean Patent Application No. 10-2019-0169528, dated Nov. 5, 2020 (9 pages).

(Continued)

*Primary Examiner* — Benjamin Kendall
(74) *Attorney, Agent, or Firm* — Procopio, Cory, Hargreaves & Savitch LLP (57) ABSTRACT

Embodiments of the inventive concept provide a substrate processing apparatus. The substrate treating apparatus comprises a process treating unit providing a treating space performed treating the substrate; a plasma generating unit generating the plasma discharging a process gas, and supplying the plasma to the treating space. The plasma generating unit provides a plasma chamber having a generating space of the plasma; an antenna wound to surround the plasma chamber outside the plasma chamber; a first coating film covering inside walls of the plasma chamber and comprising yttrium fluoride (YF3).

15 Claims, 10 Drawing Sheets

(56) References Cited

U.S. PATENT DOCUMENTS

| | | | |
|---|---|---|---|
| 2008/0054194 A1* | 3/2008 | Kim | H01J 37/32495 250/492.21 |
| 2010/0041238 A1* | 2/2010 | Cooperberg | H01J 37/321 156/345.33 |
| 2010/0119843 A1* | 5/2010 | Sun | H01J 37/32477 427/523 |
| 2013/0162142 A1 | 6/2013 | Nishino et al. | |
| 2014/0083612 A1* | 3/2014 | Ji | H01J 37/32633 156/345.43 |
| 2015/0311043 A1 | 10/2015 | Sun et al. | |
| 2017/0040146 A1* | 2/2017 | Huang | H01J 37/32504 |
| 2018/0105701 A1 | 4/2018 | Larsson et al. | |

FOREIGN PATENT DOCUMENTS

| | | |
|---|---|---|
| CN | 110391123 A | 10/2019 |
| CN | 110473802 A | 11/2019 |
| JP | 2012-57251 A | 3/2012 |
| JP | 201398172 A | 5/2013 |
| JP | 2013140950 A | 7/2013 |
| KR | 1020110110517 A | 10/2011 |
| KR | 10-2014-0105456 A | 9/2014 |
| KR | 10-2015-0110948 A | 10/2015 |
| TW | I335609 B | 1/2011 |
| TW | 201943870 A | 11/2019 |
| WO | 2010/087648 A2 | 8/2010 |

OTHER PUBLICATIONS

Notice of Allowance for related Korean Patent Application No. 10-2019-0169528, dated Feb. 22, 2021 (5 pages).
Japanese Office Action for related Application No. 2020-204790, dated Dec. 7, 2021, 4 pages.
Singapore Search Report for related Application No. 10202012351 U, dated Oct. 7, 2021, 3 pages.
Singapore Written Opinion for related Application No. 10202012351 U, dated Oct. 7, 2021, 8 pages.
Taiwanese Office Action for related Application No. 109142714, dated Feb. 7, 2022, 10 pages.

* cited by examiner

SUBSTRATE PROCESSING APPARATUS

CROSS-REFERENCE TO RELATED APPLICATIONS

A claim for priority under 35 U.S.C. § 119 is made to Korean Patent Application No. 10-2019-0169528 filed on Dec. 18, 2019, in the Korean Intellectual Property Office, the entire contents of which are hereby incorporated by reference.

BACKGROUND

Embodiments of the inventive concept described herein relate to a substrate treating apparatus, more particularly, a substrate treating apparatus using a plasma.

Plasma corresponds to an ionized gas comprising ions, radicals, electrons, and the like. The plasma is generated by very high temperature, strong electric fields, or radio frequency electromagnetic fields (RF Electromagnetic Fields). To manufacture semiconductor elements, various processes are performed such as ashing or etching to remove a thin film on a substrate using a plasma. A film on a substrate is ashed or etched through physical collision or chemical reaction with ions and radical particles contained the plasma.

In general, the plasma is generated in a chamber. A process gas is supplied into the chamber. The process gas supplied into the chamber is excited as the plasma by electromagnetic field generated in the chamber. The plasma collides with the chamber. The chamber is etched by colliding with the plasma. By this etching, foreign matters like particles are generated in the chamber. To minimize generating the foreign matters in the chamber, a method of forming a coating film on inside walls of the chamber is suggested. The coating film minimizes a direct reaction between the plasma and the inside walls of the chamber. But the general coating film can be easily damaged by a heat stress caused by the plasma having high temperature and by physical collision by the plasma.

On the other hand, etching the inside walls of the chamber or generating the foreign matters in the chamber are more often in an Inductively Coupled Plasma apparatus than a Capacitively Coupled Plasma apparatus. The CCP apparatus comprises an upper electrode and a lower electrode. And an electric field is generated between the upper electrode and the lower electrode. The plasma is generated between the upper electrode and the lower electrode both having the electric field. The generated plasma moves along a direction of the electric field which generated between the upper electrode and the lower electrode. That is, the plasma of the CCP apparatus often collides with two electrodes (the upper electrode and the lower electrode) not with the inside walls of the chamber. But the ICP apparatus has a plasma reaction chamber. The plasma reaction chamber is surrounded by an antenna coil. An alternating current which flows through the antenna coil and generates the electric field inside the plasma reaction chamber. The generated electric field generates the plasma. The plasma of the plasma reaction chamber moves toward one end and an opposite end of the antenna coil. A movement of the plasma comprises the movement toward inside walls of the chamber. That is, a collision between the plasma and the inside walls of the chamber in the ICP apparatus is stronger than a collision between the plasma and the inside walls of the chamber in the CCP apparatus. In addition, the collision in the ICP apparatus is more frequent than the CCP apparatus.

SUMMARY

Embodiments of the inventive concept provide a substrate treating apparatus.

In addition, embodiments of the inventive concept provide a substrate treating apparatus capable of minimizing a generation of foreign matters when inside walls of a chamber react with a plasma.

In addition, embodiments of the inventive concept provide a substrate treating apparatus capable of making a lifetime of the plasma chamber longer.

In addition, embodiments of the inventive concept provide a substrate treating apparatus capable of minimizing a damage of a coating film covering the inside walls of the plasma chamber, and capable of minimizing detachment of the coating film from the inside walls of the plasma chamber.

The inventive concept may be embodied in many different forms, and should not be construed as being limited to the embodiments set forth herein. The inventive concept and methods of accomplishing the same may be understood more readily by reference to the following detailed description of embodiments and the accompanying drawings.

Embodiments of the inventive concept provide a substrate processing apparatus. The substrate treating apparatus comprises a process treating unit providing a treating space performed treating the substrate; a plasma generating unit generating the plasma by discharging a process gas, and supplying the plasma to the treating space. The plasma generating unit provides a plasma chamber having a plasma generating space; an antenna wound to surround the plasma chamber multiple times outside the plasma chamber; a first coating film covering inside walls of the plasma chamber and comprising yttrium fluoride (YF3).

According to an exemplary embodiment, a second coating film covering the inside walls of the plasma chamber and comprising yttrium oxide (Y2O3) may be further provided.

According to an exemplary embodiment, the second coating film may be provided on the inside walls of the plasma chamber, and the first coating film may be provided on the second coating film.

According to an exemplary embodiment, when viewed from a front cross-section of the plasma chamber, when it comes to a thickness of the first coating film, the thickness of an upper area and a lower area of the plasma chamber is thicker than a central area of the plasma chamber.

According to an exemplary embodiment, in the entire inside walls of the plasma chamber, the sum of the thicknesses of the first coating film and the second coating film may be the same.

According to an exemplary embodiment, when viewed from a front cross-section of the plasma chamber, the first coating film may be provided to the upper area and the lower area among the upper area, the lower area, and a central area of the plasma chamber, and the second coating film may be provided to the central area.

According to an exemplary embodiment, the antenna is an ICP antenna, one end of the antenna may be connected to a power source applying a power to the antenna, and an opposite end of the antenna may be grounded.

According to an exemplary embodiment, when viewed from a front cross-section of the plasma chamber, each height of the one end and the opposite end of the antenna corresponds to the upper area and the lower area respectively of the plasma chamber.

According to an exemplary embodiment, the plasma generating unit comprises a gas supply unit supplying a process gas to the plasma generating space, and the process gas may comprise fluorine and/or hydrogen.

According to an exemplary embodiment, the plasma chamber may be formed of a material comprising aluminum oxide (Al2O3).

According to an exemplary embodiment, the plasma generating unit is arranged below the plasma chamber and may further comprise a diffusion chamber having a diffusion space for diffusing the plasma generated in the plasma chamber.

In addition, the inventive concept provides an apparatus for treating the substrate using the plasma. The apparatus for treating the substrate using the plasma comprises a chamber; a gas supply unit supplying process gas into the chamber; a plasma source generating the plasma in the chamber; a first coating film covering the inside walls of the chamber; and a second coating film covering the inside walls of the chamber and provided in a material different from the first coating film.

According to an exemplary embodiment, the second coating film may be provided on the inside walls of the chamber, and the first coating film may be provided on the second coating film.

According to an exemplary embodiment, when viewed from a front cross-section of the plasma chamber, when it comes to a thickness of the first coating film, the thickness of the upper area and the lower area of the plasma chamber is thicker than the central area of the plasma chamber.

According to an exemplary embodiment, in the entire inside walls of the chamber, the sum of the thicknesses of the first coating film and the second coating film may be the same.

According to an exemplary embodiment, when viewed from a front cross-section of the plasma chamber, the first coating film may be provided to the upper area and the lower area among the upper area, the lower area, and a central area of the plasma chamber, and the second coating film may be provided to the central area.

According to an exemplary embodiment, the chamber is a plasma chamber for generating the plasma, and at the outside the plasma chamber, the antenna is wound multiple times on the plasma chamber.

According to an exemplary embodiment, the antenna is an ICP antenna, one end of the antenna may be connected to a power source applying a power to the antenna, and an opposite end of the antenna may be grounded.

According to an exemplary embodiment, the first coating film comprises yttrium fluoride (YF3), and the second coating film comprises yttrium oxide (Y2O3).

According to an exemplary embodiment, the chamber may be formed of a material comprising aluminum oxide (Al2O3).

According to an exemplary embodiment, the process gas comprises Fluorine and/or Hydrogen.

According to an exemplary embodiment, the inventive concept provides a substrate treating apparatus capable of efficiently treating a substrate.

In addition, according to an exemplary embodiment, the inventive concept can minimize a foreign matter which is generated when inside walls of a chamber react with a plasma.

In addition, according to an exemplary embodiment, the inventive concept can extend a life span of the plasma chamber.

In addition, according to an exemplary embodiment, the inventive concept can minimize a damage of a coating film covering inside walls of a plasma chamber, or detachment of a coating film from the inside walls of the plasma chamber.

The inventive concept and methods of accomplishing the same may be understood more readily by reference to the following detailed description of embodiments and the accompanying drawings. However, the inventive concept may be embodied in many different forms, and should not be construed as being limited to the embodiments set forth herein. Rather, these embodiments are provided so that this inventive concept will be thorough and complete and will fully convey the concept of the invention to those skilled in the art, and the inventive concept will only be defined by the appended claims.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, the inventive concept and methods of accomplishing the same may be understood more readily by reference to the following detailed description of embodiments and the accompanying drawings. However, the inventive concept may be embodied in many different forms, and should not be construed as being limited to the embodiments set forth herein. Rather, these embodiments are provided so that this inventive concept will be thorough and complete and will fully convey the concept of the invention to those skilled in the art, and the inventive concept will only be defined by the appended claims.

Unless defined otherwise, all terms used herein, including technical or scientific terms, have the same meaning as commonly understood by one of ordinary skill in the art to which this invention belongs. Terms such as those defined in commonly used dictionaries should be interpreted as having a meaning that is consistent with their meaning in the context of the relevant art and are not to be interpreted in an idealized or overly formal sense unless expressly so defined herein. The term used herein describes the embodiment of the present disclosure and not be limited to the present disclosure.

As used herein, the singular forms "a", "an", and "the" are intended to include plural referents as well, unless the context clearly indicates otherwise. It will be further understood that the terms "comprise" and/or various conjugational forms of this verb, such as "comprisal", "comprising", "comprised", do not preclude the presence or addition of one or more other constructions, components, devices, steps, actions.

The term "and/or" in this description refers to each of the configuration or to various combinations thereof.

The term used herein "part", which processes at least one function or operation, for example, may mean software devices and hardware devices such as FPGA, or ASIC. However, "part" does not be limited by software or hardware. "part" may be composed of an addressable storage medium, or one or more processors running thereof. According to one exemplary embodiment of the inventive concept, "part" may include devices such as software devices, object-oriented software devices, class devices, and processes, functions, attributes, procedures, sub-routines, segments of program codes, drivers, firmware, microcode, circuits, data, databases, data structure, tables, arrays, and variables. Functions from devices and "part" may be separately performed by the plurality of devices and "part", or be combined with additional devices.

Hereinafter, embodiments of the inventive concept are described with reference to FIG. 1 to FIG. 10.

Figure 1:
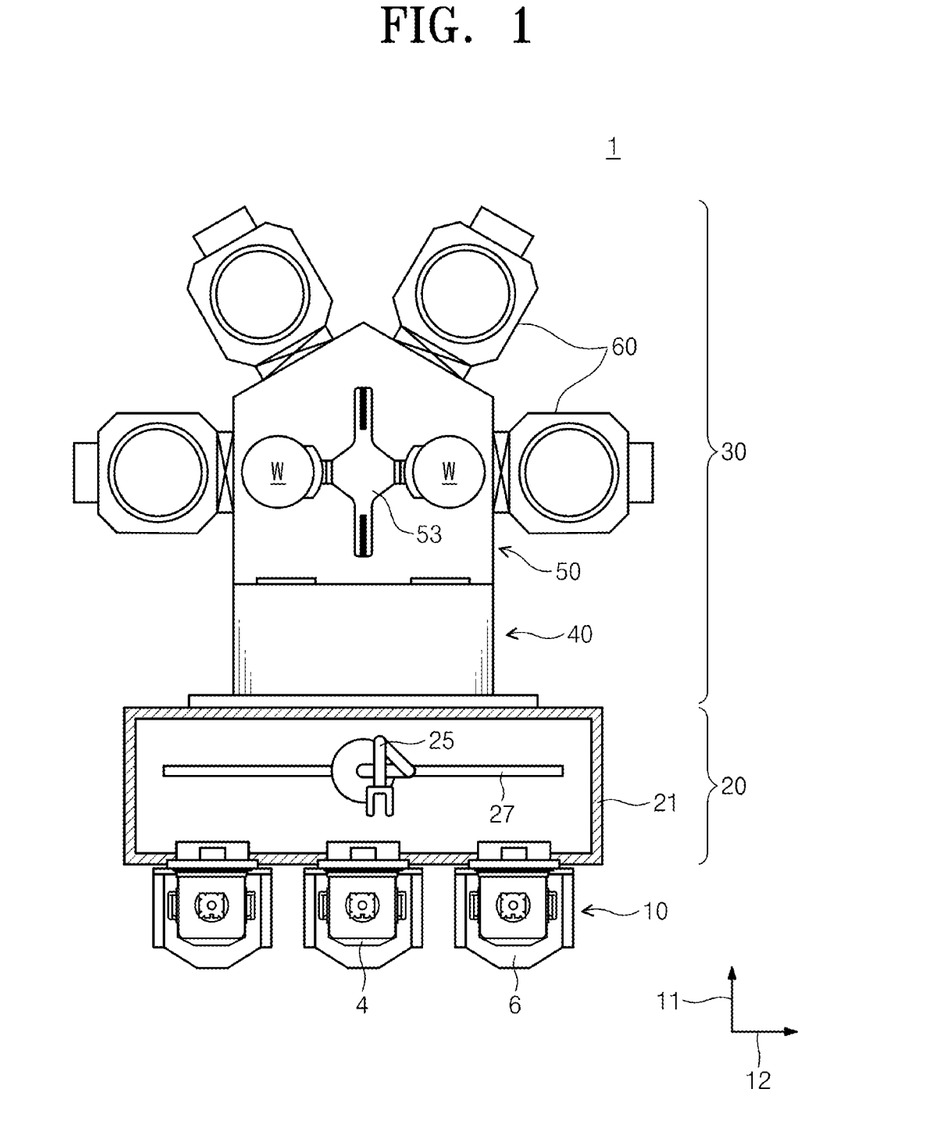
FIG. 1 schematically shows a substrate treating apparatus of the inventive concept.

FIG. 1 schematically shows a substrate treating apparatus of the inventive concept. Referring to FIG. 1, a substrate treating equipment 1 has an equipment front end module (EFEM) 20 and a treating module 30. The EFEM 20 and the treating module 30 are arranged in a direction.

The EFEM 20 has a load port 10 and a transfer frame 21. The load port 10 is arranged in front of the EFEM 20 along a first direction 11. The load port 10 has a plurality of support parts 6. Each support part 6 is arranged in parallel along a second direction 12, and a carrier 4 (e.g. a cassette player, FOUP) is mounted. The carrier receives a substrate 'W' to be processed and a substrate 'W' processed. The transfer frame 21 is arranged between the load port 10 and the treating module 30. The transfer frame 21 comprises a first transfer robot 25, the first transfer robot is arranged inside the transfer frame 21 and transfers the substrate 'W' between the load port 10 and the treating module 30. The first transfer robot 25 moves along a transfer rail 27 installed along the second direction 12, and the first transfer robot 25 transfers the substrate 'W' between the carrier 4 and the treating module 30.

The treating module 30 comprises a load lock chamber 40, a transfer chamber 50, and a process chamber 60.

The load lock chamber 40 is adjacently arranged to the transfer frame 21. In one example, the load lock chamber 40 is arranged between the transfer chamber 50 and the EFEM 20. Before the substrate 'W' to be processed is transferred to the process chamber 60 or the substrate 'W' processed is transferred to the EFEM 20, the load lock chamber 40 provides a space where the substrate 'W' stands by.

The transfer chamber 50 is adjacently arranged to the load lock chamber 40. When viewed from above, the transfer chamber 50 is a polygon. Referring to FIG. 1, when viewed from above, the transfer chamber 50 is a pentagon. At the outside of the transfer chamber 50, the load lock chamber 40 and a plurality of process chambers 60 are arranged along a perimeter of the transfer chamber 50. A passage (not shown) where the substrate 'W' is introduced and withdrawn is formed at each side walls of the transfer chamber 50, the passage (not shown) connects the transfer chamber 50 and the load lock chamber 40 or connects process chambers 60. Each passage has a door (not shown) which opens and closes the passage to seal the inside of the transfer chamber. A second transfer robot 53 is arranged inside of the transfer chamber 50. The second transfer robot 53 transfers the substrate 'W' between the load lock chamber 40 and the process chambers 60. The second transfer robot 53 transfers an untreated substrate 'W' which is stood by in the load lock chamber 40 to the process chamber 60, or transfers a treated substrate 'W' to the load lock chamber 40. And the second transfer robot 53 transfers the substrate 'W' among process chambers 60 for providing the substrate 'W' sequentially to the plurality of process chambers 60. Like FIG. 1, when the transfer chamber 50 is a pentagon, the load lock chamber 40 is arranged at a side wall of the transfer chamber 50 which is adjacent to the EFEM 20, and process chambers 60 are arranged sequentially at the other wall. The transfer chamber 50 may have various shape according to a requirement of a process module other than the above shape.

The process chambers 60 are arranged along a perimeter of the transfer chamber 50. A plurality of the process chambers 60 may be provided. In each process chamber 60, a process treatment of the substrate 'W' is performed. In the process chamber 60, the substrate 'W' is treated by receiving from the second transfer robot 53, and the treated substrate 'W' is provided to the second transfer robot 53. The process treatment of each process chamber 60 may be different. Hereinafter, a substrate treating apparatus 1000 performing a plasma treating process will be described.

Figure 2:
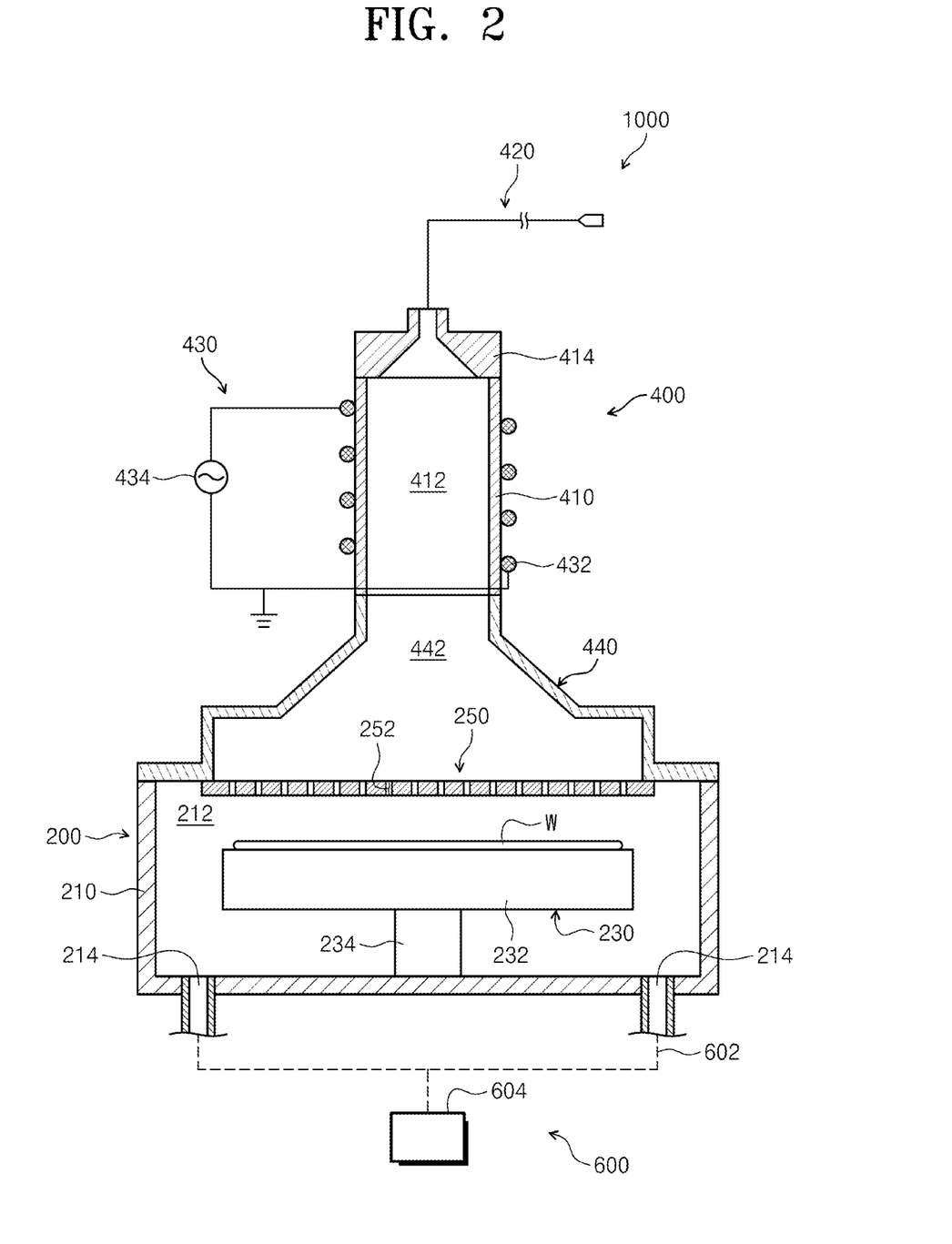
FIG. 2 shows a substrate treating apparatus performing a plasma treating process of a process chamber of the FIG. 1.

FIG. 2 shows a substrate treating apparatus performing a plasma treating process of a process chamber of the FIG. 1. Referring to FIG. 2, a substrate treating apparatus 1000 performs a predetermined process on the substrate 'W' using the plasma. For example, the substrate treating apparatus 1000 may etch or ash a thin film on the substrate 'W'. The thin film may comprise a polysilicon film, a silicon oxide film, and a silicon nitride film. In addition, the thin film may be a native oxide film or a chemically generated oxide film.

The substrate treating apparatus 1000 have a process treating unit 200, a plasma generating unit 400, and an exhaust unit 600.

The process treating unit 200 provides a treating space 212 in which a substrate 'W' is placed and the treating space 212 treats the substrate 'W'. The plasma generating unit 400 discharges the process gas to generate the plasma, and supplies the plasma to the treating space 212 of the process treating unit 200. The exhaust unit 600 discharges the process gas remaining in the process treating unit 200 and/or the reacted by-products generated in the substrate treating process to the outside, and the exhaust unit 600 maintains a pressure in the process treating unit 200 at a set pressure.

The process treating unit 200 may comprise a housing 210, a support unit 230, and a baffle 250.

The housing 210 may have the treating space 212 therein, which performs the substrate treating process. An upper portion of the housing 210 is opened, and an opening (not shown) may be formed on side walls of the housing 210. The substrate 'W' enters into the housing 210 via the opening (not shown). A door (not shown) which is kind of an open and close member may open and close the opening (not shown). In addition, an exhaust hole 214 is formed on a bottom surface of the housing 210. The process gas and/or by-products in the treating space 212 may be exhausted to the outside via the exhaust hole 214. The exhaust hole 214 may be connected to the configuration of the exhaust unit 600, which will be described hereinafter.

The support unit 230 supports the substrate 'W' in the treating space 212. The support unit 230 may comprise a support plate 232, and a support shaft 234. The support plate 232 supports the substrate 'W' in the treating space 212. The support plate 232 is supported by the support shaft 234. The support plate 232 is connected to an external power source and generates static electricity by the applied power. The electrostatic force of static electricity may fix the substrate 'W' to the support unit 230.

The support shaft 234 may move an object. For example, the support shaft 234 may move the substrate 'W' up and down. For example, the support shaft 234 may be coupled to the support plate 232, and may move the support plate 232 up and down to move the substrate 'W'.

The baffle 250 is positioned above the support unit 230 to face the support unit 230. The baffle 250 may be arranged between the support unit 230 and the plasma generating unit 400. The plasma generated from the plasma generating unit 400 may pass through a plurality of holes 252 formed in the baffle 250.

The baffle 250 allows the plasma entering the treating space 212 to be uniformly supplied to the substrate 'W'. The holes 252 formed in the baffle 250 are provided in through-holes provided from the upper surface to the lower surface of the baffle 250, and the holes 252 may be uniformly formed in each area of the baffle 250.

The plasma generating unit 400 may be positioned at the upper portion of the housing 210. The plasma generating unit 400 generates the plasma by discharging the process gas, and supplies the generated plasma to the treating space 212. The plasma generating unit 400 may comprise a plasma chamber 410, a gas supply unit 420, a power supply unit 430, and a diffusion chamber 440.

An upper and a lower surface of the plasma chamber 410 may be opened. The plasma chamber 410 may be container having opened upper and lower surfaces. The plasma chamber 410 may be cylindrical shaped container having opened upper and lower surfaces. The plasma chamber 410 may have a plasma generating space 412. In addition, a material of the plasma chamber 410 may comprise aluminum oxide (Al2O3). The upper surface of the plasma chamber 410 may be sealed by a gas supply port 414. The gas supply port 414 may be connected to the gas supply unit 420. The process gas may be supplied to the plasma generating space 412 through the gas supply port 414. The gas supplied to the plasma generating space 412 may be introduced into the treating space 212 through the baffle 250.

The gas supply unit 420 may supply a process gas. The gas supply unit 420 may be connected to the gas supply port 414. The process gas supplied by the gas supply unit 420 may comprise fluorine and/or hydrogen.

The power supply unit 430 applies RF power to the plasma generating space 412. The power supply unit 430 may be a plasma source that excites a process gas in the plasma generating space 412 to generate a plasma. The power supply unit 430 may comprise an antenna 432, and a power source 434.

The antenna 432 may be an inductively coupled plasma (ICP) antenna. The antenna 432 may be provided in a coil shape. The antenna 432 may be wound multiple times on the plasma chamber 410 outside the plasma chamber 410. The antenna 432 may be wound multiple times in a spiral shape on the plasma chamber 410 outside the plasma chamber 410. The antenna 432 may be wound on the plasma chamber 410 in an area corresponding to the plasma generating space 412.

When viewed from a front cross section of the plasma chamber 410, a height of one end of the antenna 432 may correspond to an upper portion of the plasma chamber 410. When viewed from the front cross section of the plasma chamber 410, a height of an opposite end of the antenna 432 may correspond to the lower portion of the plasma chamber 410.

The power source 434 may apply power to the antenna 432. The power source 434 may apply a high frequency alternating current to the antenna 432. The high frequency alternating current applied to the antenna 432 may form an inductive electric field in the plasma generating space 412. The process gas supplied into the plasma generating space 412 may be converted to a plasma state by obtaining an energy required for ionization from the inductive electric field. Also, the power source 434 may also be connected to the one end of the antenna 432. The power source 434 may be connected to one end of an antenna 432, a height of the antenna 432 corresponds to the upper portion of the plasma chamber 410. In addition, an opposite end of the antenna 432 may be grounded. The opposite end of the antenna 432 may be grounded, a height of the antenna 432 corresponds to the lower portion of the plasma chamber 410. However, the power source 434 may be connected to the opposite end of the antenna 432 and the one end of the antenna 432 may be grounded.

The diffusion chamber 440 may diffuse the plasma generated in the plasma chamber 410. The diffusion chamber 440 may be arranged below the plasma chamber 410. An upper portion and a lower portion of the diffusion chamber 440 may be opened. The diffusion chamber 440 may be an inverted funnel shape. The upper portion of the diffusion chamber 440 may have a diameter corresponding to the plasma chamber 410. The lower portion of the diffusion chamber 440 may have a larger diameter than the upper portion of the diffusion chamber 440. The lower portion diameter of the diffusion chamber 440 may be larger than the upper portion diameter. Also, the diffusion chamber 440 may have a diffusion space 442. The plasma generated in the plasma generating space 412 may diffuse through the diffusion space 442. The plasma introduced into the diffusion space 442 may be introduced into the treating space 412 through the baffle 250.

The exhaust unit 600 may exhaust process gases and by-products from the process treating unit 200 to the outside. The exhaust unit 600 may exhaust by-products generated in the process of treating the substrate 'W' to the outside of the substrate treating apparatus 1000. The exhaust unit 600 may exhaust process gases supplied into the treating space 212 to the outside. The exhaust unit 600 may comprise an exhaust line 602 and a decompression member 604. The exhaust line 602 may be connected to an exhaust hole 214 formed on the bottom surface of the housing 210. Also, the exhaust line 602 may be connected to a decompression member 604 that provides decompression. Thus, the decompression member 604 may provide decompression to the treating space 212. The decompression member 604 may be a pump. The decompression member 604 can discharge the plasma and by-products remaining in the treating space 212 to the outside of the housing 210. In addition, the decompression member 604 may provide a decompression to maintain the pressure of the treating space 212 at a predetermined pressure.

Figure 3:
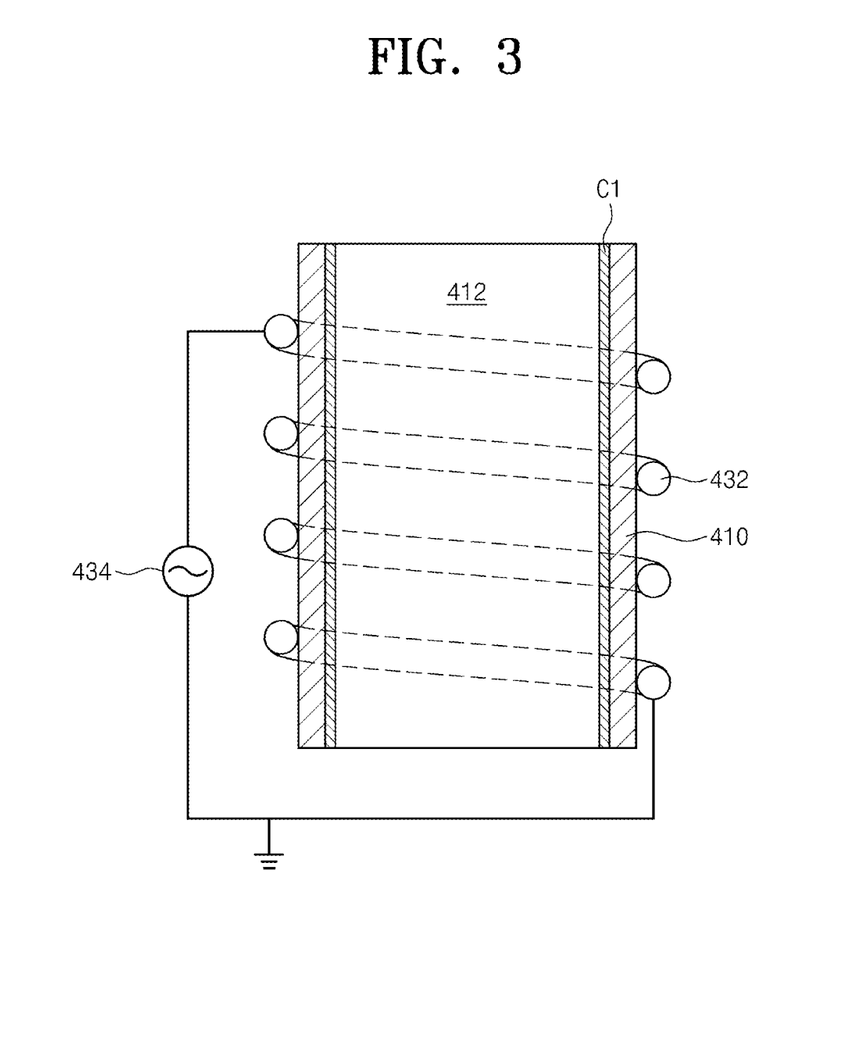
FIG. 3 shows a plasma chamber according to an embodiment of the inventive concept.

FIG. 3 shows a plasma chamber according to an embodiment of the inventive concept. Referring to FIG. 3, a first coating film C1 may be provided on inside walls of the plasma chamber 410. The first coating film C1 may cover the inside walls of the plasma chamber 410. The first coating film C1 may be provided on the inside walls of the plasma chamber 410. The first coating film C1 may be provided with the same thickness on the entire inside walls of the plasma chamber 410. The first coating film C1 may comprise yttrium fluoride (YF3). The first coating film C1 may be coated on the inside walls of the plasma chamber 410 by a method of an atmospheric plasma spray (APS). However, the first coating film C1 may be coated on the inside walls of the plasma chamber 410 by a method of an aerosol or a cold spray.

Figure 4:
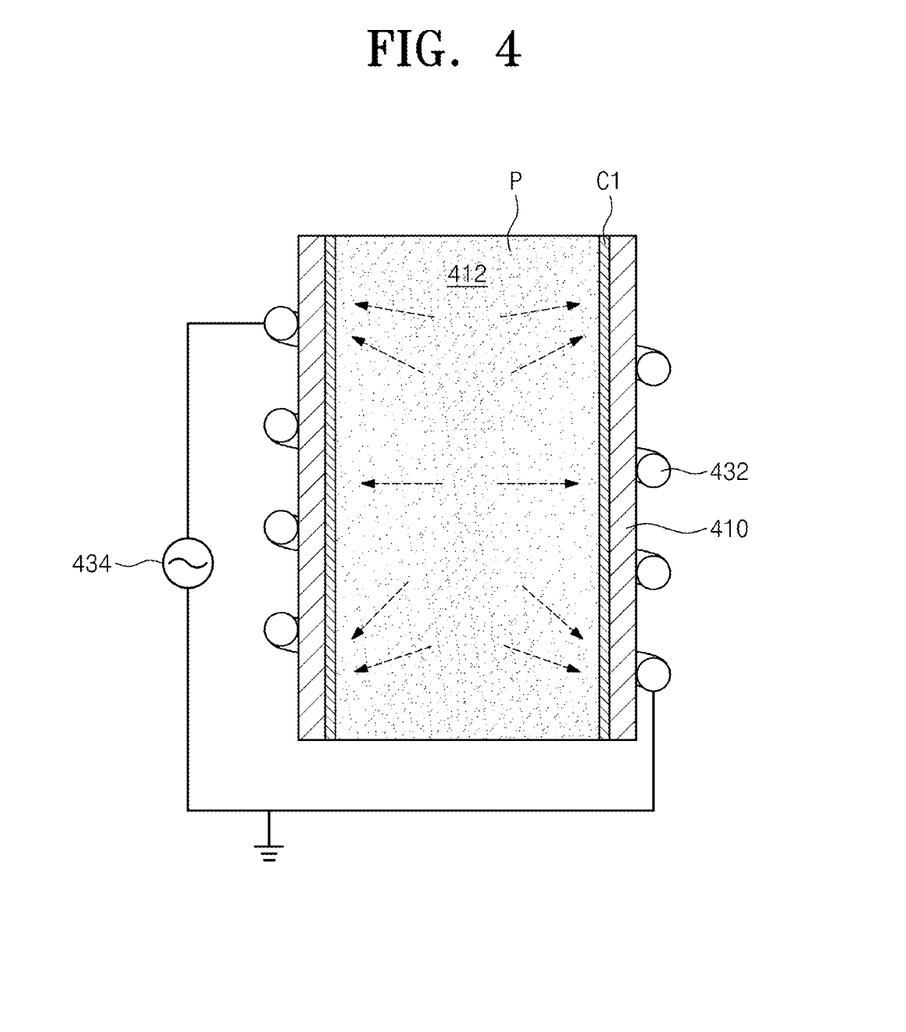
FIG. 4 shows plasma flow generated from the plasma chamber of FIG. 3.

FIG. 4 shows plasma flow generated from the plasma chamber of FIG. 3. Referring to FIG. 4, a plasma P may be generated in the plasma generating space 412 of the plasma chamber 410. Specifically, a process gas may be supplied to the plasma generating space 412. The process gas supplied to the plasma generating space 412 may be excited with a state of the plasma P by an electric field which the antenna 432 forms. When viewed from a front cross-section of the plasma chamber 410, the plasma P may move in a lateral direction. In addition, the plasma P may relatively move to the upper area and/or the lower area of the plasma chamber 410. This is because one end of the antenna 432 is provided with a height corresponding to the upper area of the plasma chamber 410, and an opposite end of the antenna 432 is provided with a height corresponding to the lower area of the plasma chamber 410. Specifically, a power source 434 is connected to the one end of the antenna 432. The opposite end of the antenna 432 is grounded. Thus, the one end of the antenna 432 and/or the opposite end have a greater potential value than the other area of the antenna 432. Accordingly, the plasma P remaining in the plasma generating space 412 moves in a direction toward the upper and lower areas of the plasma chamber 410 than the central area of the plasma chamber 410.

In the case of an inductively coupled plasma apparatus for generating the plasma P using the antenna 432 wound multiple times on the plasma chamber 410, the generated plasma P moves in a direction toward the inside walls of the plasma chamber 410. Accordingly, the plasma chamber 410 is etched by a physical force of the plasma P colliding with the plasma chamber 410, as well as a chemical reaction with the plasma P. That is, the problem that the chamber is etched by the plasma P occurs more frequently in the inductively coupled plasma apparatus than the capacitively coupled plasma apparatus. Generally, in order to minimize this problem, a method for coating yttrium oxide (Y2O3) on the inside walls of the chamber has been used. However, when a process gas comprising fluorine is applied, yttrium oxide (Y2O3) coating generates particles because the coating film is etched. In other words, the yttrium oxide (Y2O3) coating film has a low ability to suppress the generation of particles.

However, according to an embodiment of the inventive concept, the first coating film C1 comprising yttrium fluoride (YF3) is provided on the inside walls of the plasma chamber 410. Yttrium fluoride (YF3) has a high ability for suppressing the generation of particles comparing to yttrium oxide (Y2O3). Accordingly, the generation of particles may be minimized in the plasma chamber 410. The effect of suppressing the generation of particles is greater in the inductively coupled plasma apparatus for the same reasons as described above.

Figure 5:
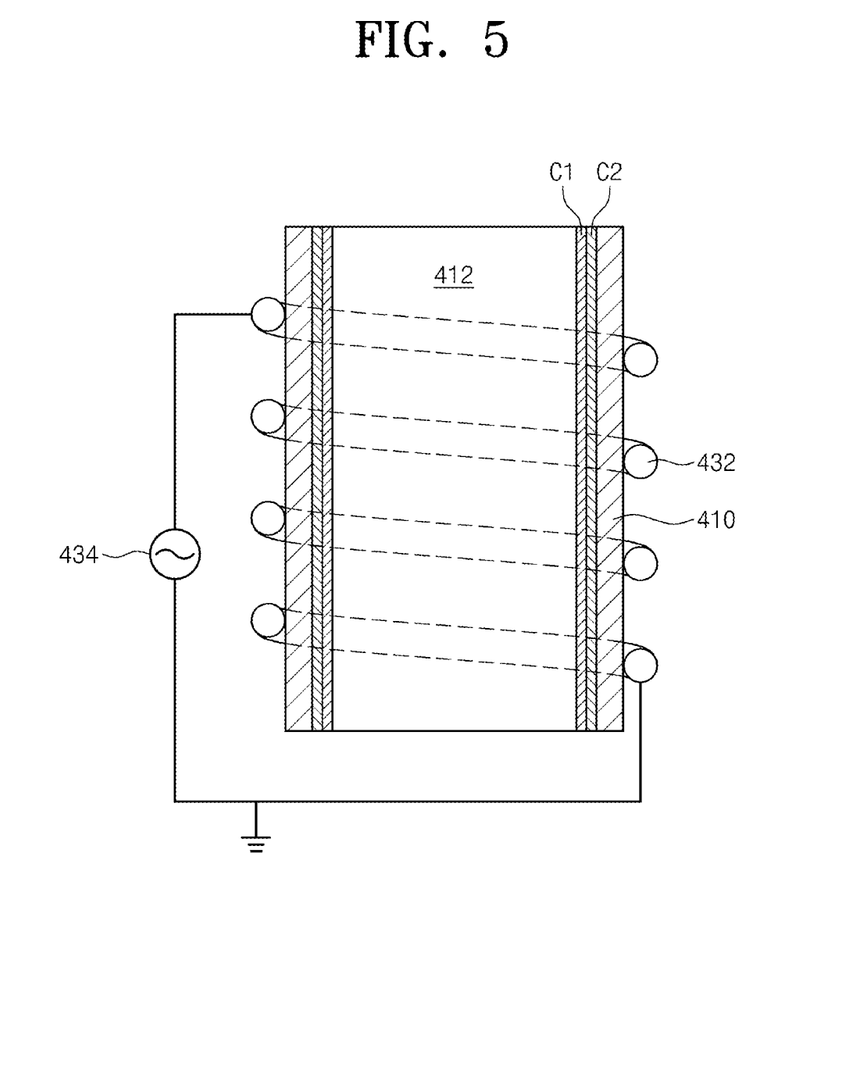
FIG. 5 shows a plasma chamber according to another embodiment of the inventive concept.

FIG. 5 shows a plasma chamber according to another embodiment of the inventive concept. Referring to FIG. 5, the first coating film C1 and a second coating film C2 may be provided on inside walls of the plasma chamber 410. The first coating film C1 and the second coating film C2 may be formed of different materials, respectively. The first coating film C1 may cover the inside walls of the plasma chamber 410. The second coating film C2 may cover the inside walls of the plasma chamber 410. A second coating film C2 may be provided on the inside walls of the plasma chamber 410. The first coating film C1 may be provided on the second coating film C2. The sum of the thicknesses of the first coating film C1 and the second coating film C2 can be the same in the entire area of the inside walls of the plasma chamber 410. In addition, a bonding ability of the first coating film C1 and the second coating film C2 may be larger than that of the first coating film C1 and the plasma chamber 410. In addition, the difference between a coefficient of thermal expansion of the second coating film C2 and that of the plasma chamber 410 may be smaller than the difference between the coefficient of thermal expansion of the second coating film C2 and that of the first coating film C1. The first coating film C1 may comprise yttrium fluoride (YF3). The second coating layer C2 may comprise yttrium oxide (Y2O3). The first coating film C1 and the second coating film C2 may be coated on the inside walls of the plasma chamber 410 by the method of an Atmospheric Plasma Spray (APS). However, the first coating film C1 and the second coating film C2 may be coated on the inside walls of the plasma chamber 410 by the method of an aerosol or a cold spray.

Figure 6:
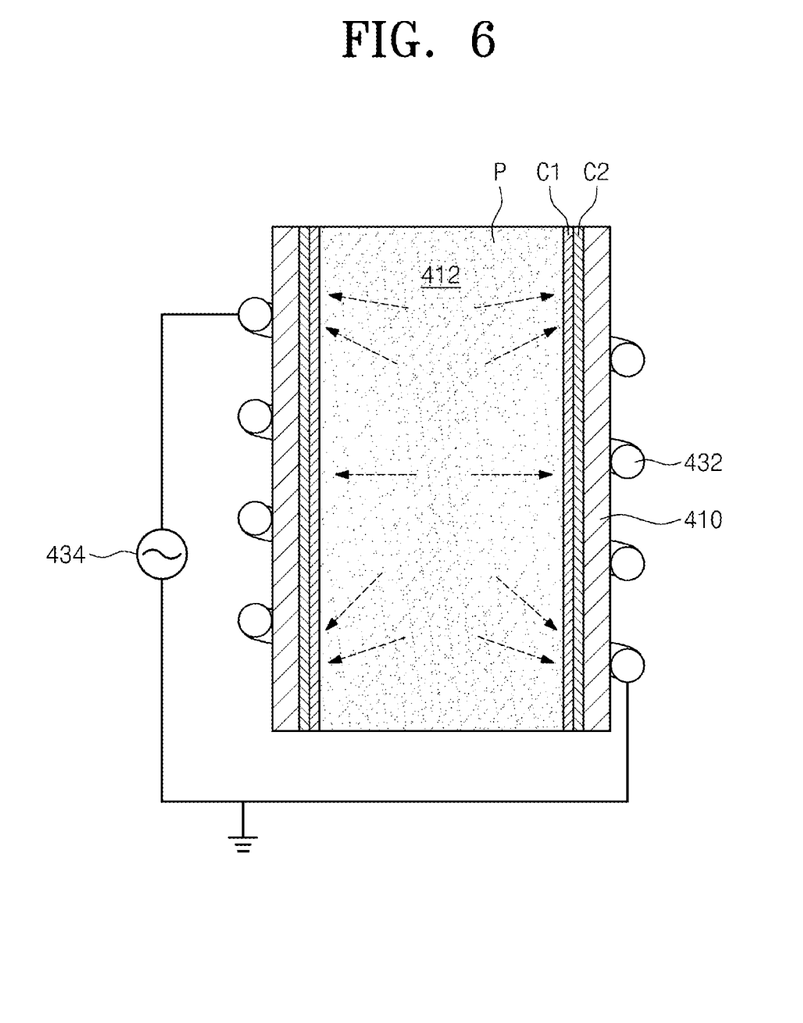
FIG. 6 shows plasma flow generated from the plasma chamber of FIG. 5.

FIG. 6 shows plasma flow generated from the plasma chamber of FIG. 5. Referring to FIG. 6, for the same or similar reasons as described above, the plasma P in the plasma generating space 412 can move in a lateral direction. In addition, the plasma P in the plasma generating space 412 can move in a direction toward the upper area and/or the lower area of the plasma chamber 410 when viewed from the front cross section of the plasma chamber 410. The first coating film C1 may be provided on the second coating film C2. The first coating film C1 may comprise yttrium fluoride (YF3) having high particle suppression ability. That is, the first coating film C1 directly collides with the plasma P of the plasma generating space 412. However, since the first coating film C1 has a superior particle suppressing ability as described above, the first coating film C1 may minimize the generation of particles in the plasma generating space 412.

Also, when the first coating film C1 is provided on the plasma chamber 410, the first coating film C1 may be damaged in the process of generating the plasma P, or the first coating film C1 may be detached from the plasma chamber 410. For example, when the plasma chamber 410 is provided in a material comprising aluminum oxide (Al2O3) and the first coating film C1 is provided in a material comprising yttrium fluoride (YF3), the difference between the coefficient of thermal expansion of the first coating film C1 and the coefficient of thermal expansion of the plasma chamber 410 is large. Heat is generated while generating the plasma P in the plasma generating space 412. By this heat, the first coating film C1 and the plasma chamber 410 are thermally deformed. When the difference between the coefficient of thermal expansion of the first coating film C1 and the plasma chamber 410 is large, the degree of thermal deformation of the first coating film C1 and the degree of thermal deformation of the plasma chamber 410 are different. Accordingly, the first coating film C1 may be detached from the plasma chamber 410 by thermal deformation.

However, in another embodiment of the inventive concept, the second coating film C2 is provided on the plasma chamber 410. In addition, the first coating film C1 is provided on the second coating film C2. Here, the difference between the coefficient of thermal expansion of the second coating film C2 and the coefficient of thermal expansion of the plasma chamber 410 is smaller than the difference between the coefficient of thermal expansion of the second coating film C2 and the coefficient of thermal expansion of the first coating film C1. For example, when the first coating film C1 comprises yttrium fluoride (YF3), the second coating film C2 comprises yttrium oxide (Y2O3), and a material of the plasma chamber 410 comprises aluminum oxide (Al2O3), the difference between the coefficient of thermal expansion of the second coating film C2 and the coefficient of thermal expansion of the plasma chamber 410 is smaller than the difference between the coefficient of thermal expansion of the second coating film C2 and the coefficient of thermal expansion of the first coating film C1. The coefficient of thermal expansion of the second coating film C2 may be the same or similar to the coefficient of thermal expansion of the plasma chamber 410. That is, the degree of thermal deformation of the second coating film C2 is the same as or similar to the degree of thermal deformation of the plasma chamber 410. Therefore, detaching the second coating film C2 from the plasma chamber 410 due to thermal deformation may be minimized.

In addition, a bonding ability between the first coating film C1 and the second coating film C2 may be larger than that of the first coating film C1 and the plasma chamber 410. For example, when the first coating film C1 comprises yttrium fluoride (YF3), the second coating film C2 comprises yttrium oxide (Y2O3), and a material of the plasma chamber 410 comprises aluminum oxide (Al2O3), the bonding ability between the first coating film C1 and the second coating film C2 may be larger than the bonding ability between the first coating film C1 and the plasma chamber 410. Accordingly, even if the degree of thermal deformation of the first coating film C1 and the second coating film C2 are different, detaching the first coating film C1 from the second coating film C2 may be minimized.

Figure 7:
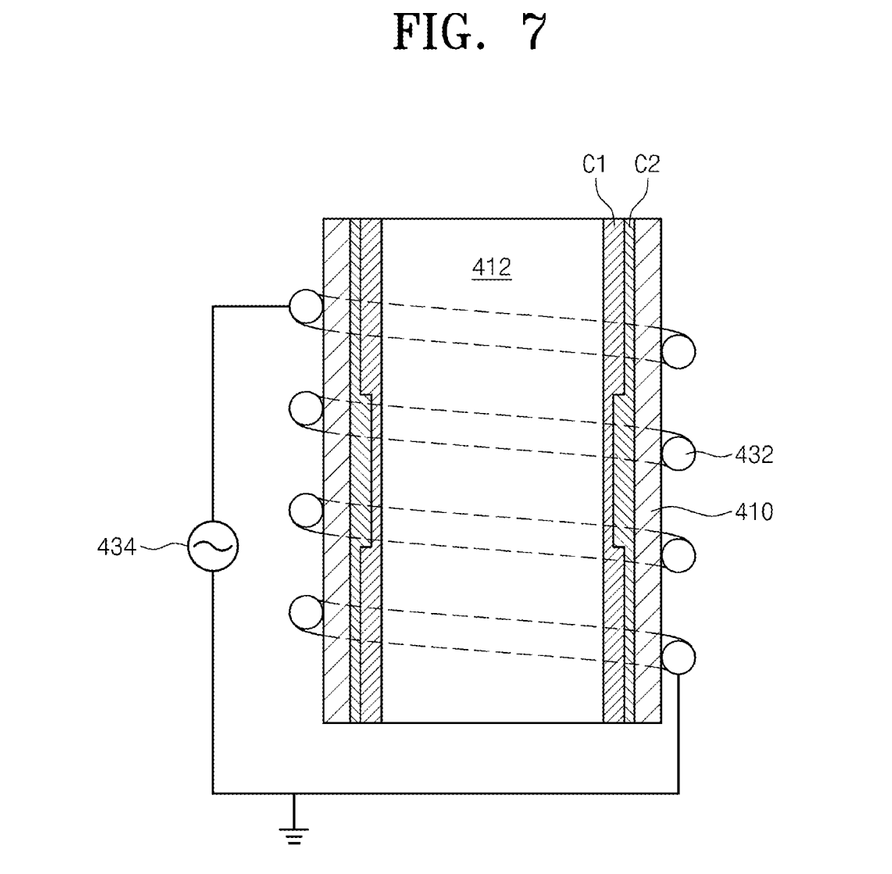
FIG. 7 shows a plasma chamber according to another embodiment of the inventive concept.

FIG. 7 shows a plasma chamber according to another embodiment of the inventive concept. Referring to FIG. 7, the first coating film C1 and the second coating film C2 may be provided on inside walls of the plasma chamber 410. The first coating film C1 may cover the inside walls of the plasma chamber 410. The second coating film C2 may cover the inside walls of the plasma chamber 410. A second coating film C2 may be provided on the inside walls of the plasma chamber 410. The first coating film C1 may be provided on the second coating film C2.

In addition, when viewed from a front cross-section of the plasma chamber, when it comes to a thickness of the first coating film C1, the thickness of an upper area and a lower area of the plasma chamber 410 is thicker than a central area of the plasma chamber 410. The sum of the thicknesses of the first coating film C1 and the second coating film C2 may be the same in the entire area of the inside walls of the plasma chamber 410. In addition, a bonding ability between the first coating film C1 and the second coating film C2 may be larger than that of the first coating film C1 and the plasma chamber 410. In addition, the difference between a coefficient of thermal expansion of the second coating film C2 and that of the plasma chamber 410 may be smaller than the difference between the coefficient of thermal expansion of the second coating film C2 and that of the first coating film C1. The first coating film C1 may comprise yttrium fluoride (YF3). The second coating layer C2 may comprise yttrium oxide (Y2O3). The first coating film C1 and the second coating film C2 may be coated on the inside walls of the plasma chamber 410 by the method of an atmospheric plasma spray (APS). However, the first coating film C1 and the second coating film C2 may be coated on the inside walls of the plasma chamber 410 by the method of an aerosol or a cold spray.

Figure 8:
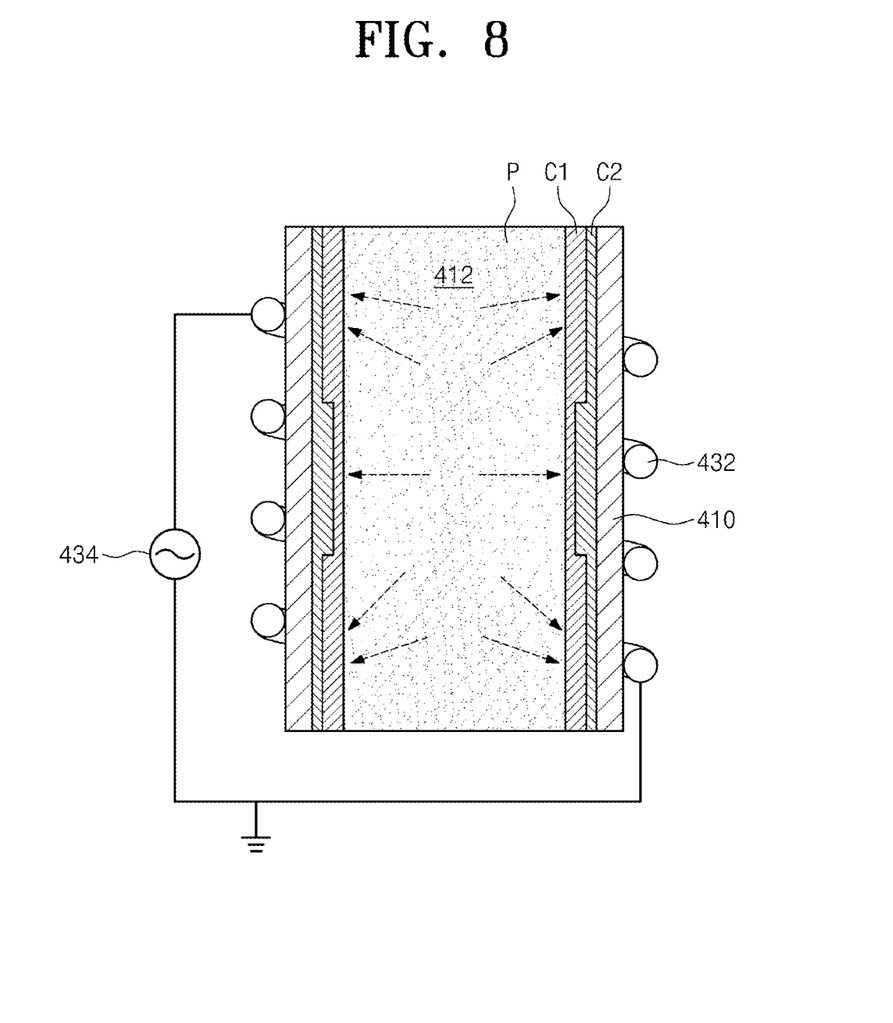
FIG. 8 shows plasma flow generated from the plasma chamber of FIG. 7.

FIG. 8 shows plasma flow generated from the plasma chamber of FIG. 7. Referring to FIG. 8, for the same or similar reasons as described above, the plasma P in the plasma generating space 412 can move in a lateral direction. In addition, the plasma P in the plasma generating space 412 can move in a direction toward the upper area and/or the lower area of the plasma chamber 410 when viewed from the front cross-section of the plasma chamber 410. Accordingly, etching the first coating film C1 by the plasma P may be performed more in the upper area and the lower area of the plasma chamber 410 than the central area of the plasma chamber 410.

If the thickness of the first coating film C1 and the second coating film C2 are the same and the first coating film C1 provided to the upper area and the lower area of the plasma chamber 410 is etched, the plasma chamber 410 should be replaced or the coating film of the plasma chamber 410 should be re-coated. However, according to another embodiment of the inventive concept, the thickness of the first coating film C1 provided to the upper and lower areas of the plasma chamber 410 is thick. In other words, by making higher thickness of the first coating film C1 which has a high ability of suppressing particles in the upper and lower areas of the plasma chamber 410 where frequently collided with the plasma P, a useful life of the plasma chamber 410 may be increased. Other embodiments of the inventive concept described in FIGS. 7 and 8 are the same as or similar to those of the above-described embodiments, and thus detailed descriptions thereof will be omitted.

Figure 9:
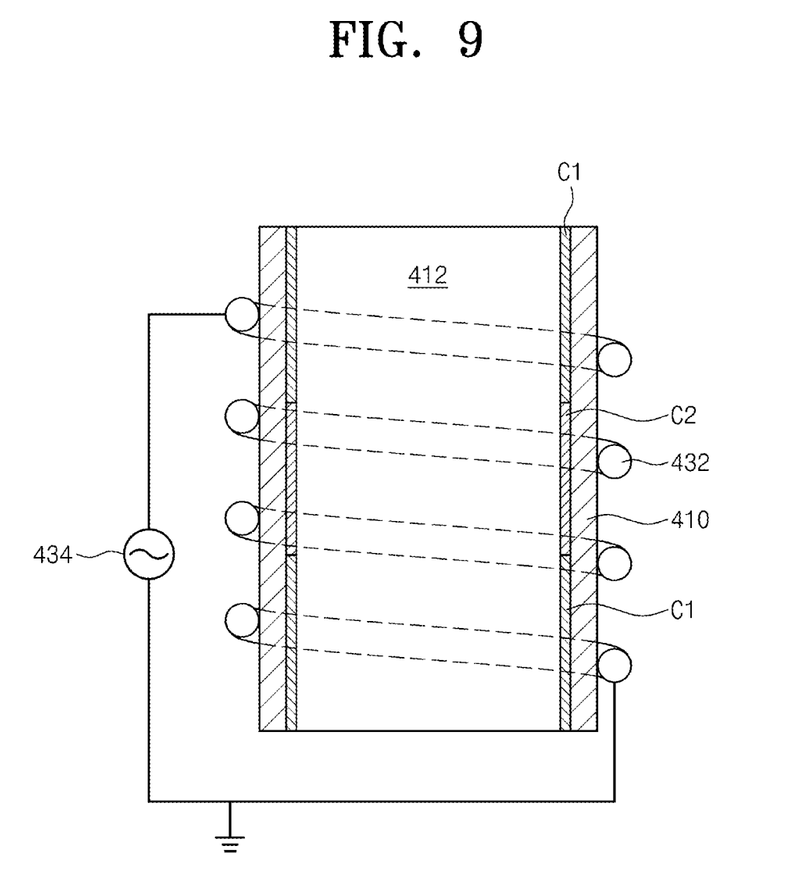
FIG. 9 shows a plasma chamber according to another embodiment of the inventive concept.

FIG. 9 shows a plasma chamber according to another embodiment of the inventive concept. Referring to FIG. 9, the first coating film C1 and a second coating film C2 may be provided on inside walls of the plasma chamber 410. The first coating film C1 may cover the inside walls of the plasma chamber 410. The second coating film C2 may cover the inside walls of the plasma chamber 410. The first coating film C1 may be provided on the inside walls of the plasma chamber 410. A second coating film C2 may be provided on the inside walls of the plasma chamber 410. The first coating film C1 may be provided with the same thickness on the entire inside walls of the plasma chamber 410. The second coating film C2 may be provided with the same thickness on the entire inside walls of the plasma chamber 410. The thickness of the first coating film C1 and the second coating film C2 may be similar. When viewed from a front cross section of the plasma chamber 410, the first coating film C1 may be provided to the upper and the lower areas of the plasma chamber 410. When viewed from the front cross section of the plasma chamber 410, the second coating film C2 may be provided to the central area of the plasma chamber 410.

In addition, the difference between a coefficient of thermal expansion of the second coating film C2 and that of the plasma chamber 410 may be smaller than the difference between the coefficient of thermal expansion of the second coating film C2 and that of the first coating film C1. The first coating film C1 may comprise yttrium fluoride (YF3). The second coating layer C2 may comprise yttrium oxide (Y2O3). The first coating film C1 and the second coating film C2 may be coated on the inside walls of the plasma chamber 410 by the method of an Atmospheric Plasma Spray (APS). However, the first coating film C1 and the second coating film C2 may be coated on the inside walls of the plasma chamber 410 by the method of an aerosol or a cold spray.

Figure 10:
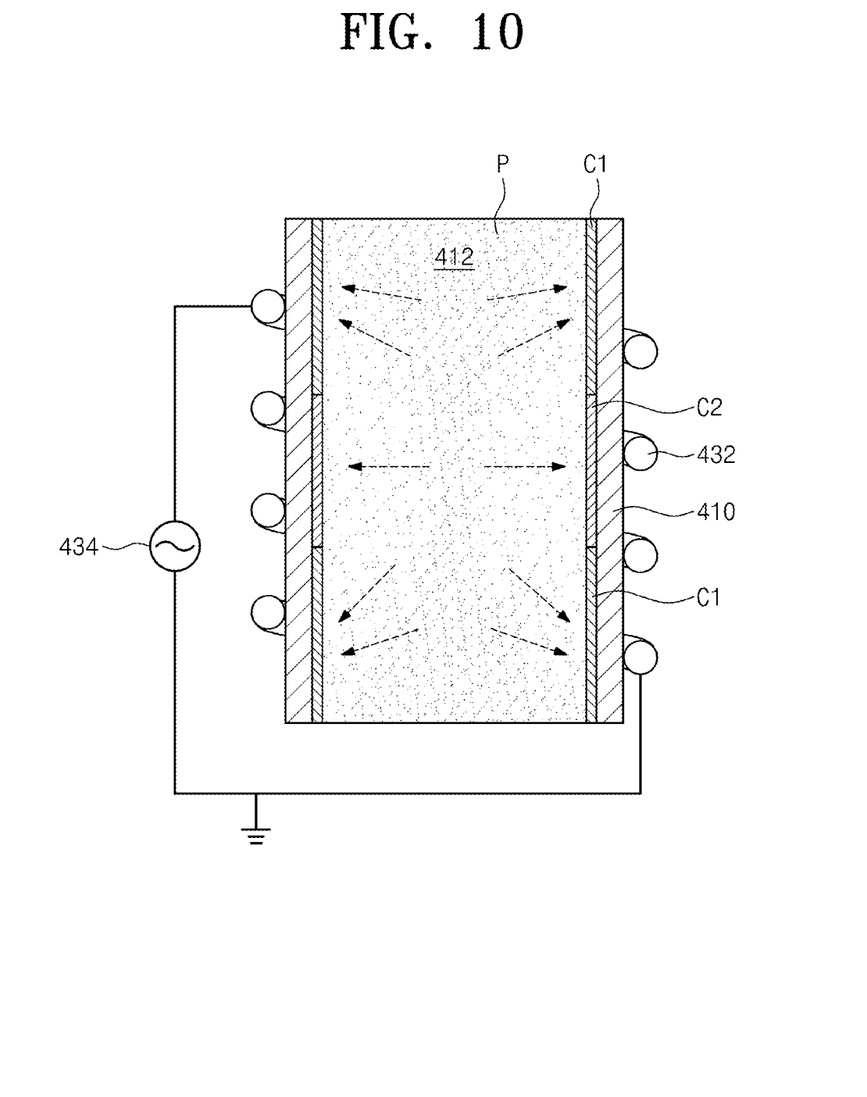
FIG. 10 shows plasma flow generated from the plasma chamber of FIG. 9.

FIG. 10 shows plasma flow generated from the plasma chamber of FIG. 9. Referring to FIG. 10, for the same or similar reasons as described above, the plasma P in the plasma generating space 412 can move in a lateral direction. In addition, the plasma P in the plasma generating space 412 can move in a direction toward the upper area and/or the lower area of the plasma chamber 410 when viewed from the front cross section of the plasma chamber 410. In addition, a temperature of the plasma generating space 412 may be higher than the upper area and/or the lower area of the plasma chamber 410. According to another embodiment of the inventive concept, the first coating film C1 is provided on the upper and lower areas of the plasma chamber 410. In addition, the second coating film C2 is provided on a central area of the plasma chamber 410. That is, since the upper area and/or the lower area of the plasma chamber 410 are in an area where a collision with the plasma P is frequent, the first coating film C1 may be provided on the upper area and the lower area of the plasma chamber 410, thereby maximally suppressing the generation of particles. In addition, since the central area of the plasma chamber 410 is the highest temperature area, the second coating film C2 having a similar thermal expansion coefficient to the plasma chamber 410 is provided on the central area of the plasma chamber 410. Accordingly, even if the second coating film C2 is thermally deformed, detaching the second coating film C2 from the plasma chamber 410 may be minimized. Other effects of other embodiments of the inventive concept described in FIGS. 9 and 10 are the same as or similar to those of the above-described embodiments, and thus detailed descriptions thereof will be omitted.

The embodiments described above can be variously applied to the substrate treating apparatus using the plasma. For example, the embodiments described above may be applied to various apparatuses performing an ashing process, a deposition process, an etching process, or a clean process using the plasma.

In addition, in the embodiments described above, the first coating film C1 comprises yttrium fluoride (YF3), and the second coating film C2 comprises yttrium oxide (Y2O3), but these are not limited hereto. For example, the first coating film C1 may comprise any one of yttrium fluoride, yttrium oxide, and yttrium oxyfluoride (YOF), and the second coating film C2 may comprise any one of yttrium fluoride, yttrium oxide, and yttrium oxyfluoride (YOF).

The above description has been made for the illustrative purpose. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to limit the inventive concept to the disclosed embodiments. Furthermore, it should be construed that the attached claims include other embodiments.

What is claimed is:

1. A substrate processing apparatus, comprising:
   a process treating unit providing a treating space performed treating the substrate; and
   a plasma generation unit generating plasma by discharging a process gas, and supplying the plasma to the treating space,
   wherein the plasma generation unit comprises:
     a plasma chamber having a plasma generating space;
     an antenna wound to surround the plasma chamber outside the plasma chamber; and
     a first coating film covering inside walls of the plasma chamber and comprising yttrium fluoride ($YF_3$), and
   wherein, when viewed from a front cross-section of the plasma chamber, a thickness of the first coating film in an upper area, including an uppermost edge, of the plasma chamber and in a lower area, including a bottommost edge, of the plasma chamber is more than the thickness of the first coating film in a central area, including a centerline, of the plasma chamber,
   wherein the antenna is an inductively coupled plasma (ICP) antenna,
   wherein a power source applying a power to the antenna is connected to one end of the antenna, and an opposite end of the antenna is grounded, and
   wherein, when viewed from the front cross-section of the plasma chamber, the one end and the opposite end of the antenna are provided in a height corresponding to the upper area and the lower area of the plasma chamber.

2. The apparatus of claim 1 further comprising:
   a second coating film comprising yttrium oxide ($Y_2O_3$) covering the inside walls of the plasma chamber.

3. The apparatus of claim 2, wherein the second coating film is provided on the inside walls of the plasma chamber, and
   wherein the first coating film is provided on the second coating film.

4. The apparatus of claim 3, wherein, when viewed from the front cross-section of the plasma chamber, a thickness of the upper area and the lower area of the plasma chamber is thicker than the central area of the plasma chamber.

5. The apparatus of claim 4, wherein in an entirety of inside walls of the plasma chamber, a sum of the thicknesses of the first coating film and the second coating film are the same.

6. The apparatus of claim 1, wherein the plasma generation unit further comprises:
   a gas supply unit supplying a process gas to the plasma generating space, and
   wherein the process gas comprises fluorine and/or hydrogen.

7. The apparatus of claim 1, wherein the plasma chamber is formed of a material comprising aluminum oxide ($Al_2O_3$).

8. The apparatus of claim 1, wherein the plasma generation unit is arranged below the plasma chamber and further comprises a diffusion chamber having a diffusion space for diffusing the plasma generated from the plasma chamber.

9. A substrate treating apparatus using a plasma, the apparatus comprising:
   a chamber;
   a gas supply unit supplying a process gas into the chamber;
   a plasma source generating plasma in the chamber;
   a first coating film covering inside walls of the chamber; and a second coating film covering the inside walls of the chamber and provided in a material different from the first coating film, wherein, when viewed from a front cross-section of the chamber, a thickness of the first coating film in an upper area, including an uppermost edge, of the chamber and in a lower area, including a bottommost edge, of the chamber is more than the thickness of the first coating film in a central area, including a centerline, of the chamber, wherein the chamber is a plasma chamber generating the plasma, wherein at an outside the plasma chamber, an antenna is wound multiple times on the plasma chamber, wherein the antenna is an inductively coupled plasma (ICP) antenna, and wherein a power source applying a power to the antenna is connected to one end of the antenna, and an opposite end of the antenna is grounded.

10. The apparatus of claim 9, wherein the second coating film is provided on the inside walls of the chamber, and
wherein the first coating film is provided on the second coating film.

11. The apparatus of claim 10, wherein, when viewed from the front cross-section of the chamber, a thickness of the upper area and the lower area of the chamber is thicker than the central area of the chamber.

12. The apparatus of claim 11, wherein in an entirety of inside walls of the chamber, a sum of the thicknesses of the first coating film and the second coating film is the same.

13. The apparatus of claim 9, wherein the first coating film comprises yttrium fluoride ($YF_3$), and
wherein the second coating film comprises yttrium oxide ($Y_2O_3$).

14. The apparatus of claim 13, wherein the chamber is formed of a material comprising aluminum oxide ($Al_2O_3$).

15. The apparatus of claim 9, wherein the process gas comprises fluorine and/or hydrogen.

* * * * *